United States Patent
Chi

(10) Patent No.: US 9,412,708 B2
(45) Date of Patent: Aug. 9, 2016

(54) ENHANCED ESD PROTECTION OF INTEGRATED CIRCUIT IN 3DIC PACKAGE

(75) Inventor: Shyh-An Chi, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1027 days.

(21) Appl. No.: 13/009,612

(22) Filed: Jan. 19, 2011

(65) Prior Publication Data

US 2012/0182650 A1 Jul. 19, 2012

(51) Int. Cl.
*H02H 9/00* (2006.01)
*H01L 23/60* (2006.01)
*H01L 25/065* (2006.01)
*H01L 23/498* (2006.01)
*H01L 23/50* (2006.01)

(52) U.S. Cl.
CPC ............ *H01L 23/60* (2013.01); *H01L 25/0657* (2013.01); *H01L 23/49822* (2013.01); *H01L 23/50* (2013.01); *H01L 25/0655* (2013.01); *H01L 2224/14181* (2013.01); *H01L 2224/16145* (2013.01); *H01L 2224/16225* (2013.01); *H01L 2225/06513* (2013.01); *H01L 2225/06517* (2013.01); *H01L 2924/15311* (2013.01)

(58) Field of Classification Search
CPC ....................................................... H01L 23/60
USPC .................................. 361/760, 820, 751, 753
See application file for complete search history.

(56) References Cited

U.S. PATENT DOCUMENTS

| | | | |
|---|---|---|---|
| 6,329,302 B1 | 12/2001 | Francis | |
| 6,671,947 B2 * | 1/2004 | Bohr | 29/846 |
| 7,067,914 B2 | 6/2006 | Malinowski et al. | |
| 7,521,950 B2 * | 4/2009 | Bernstein et al. | 324/750.3 |
| 2008/0296697 A1 | 12/2008 | Hsu et al. | |
| 2009/0085217 A1 * | 4/2009 | Knickerbocker et al. | 257/774 |
| 2010/0237386 A1 * | 9/2010 | Lin et al. | 257/173 |
| 2011/0042795 A1 * | 2/2011 | Knickerbocker | 257/686 |
| 2011/0115082 A1 * | 5/2011 | Gluschenkov et al. | 257/738 |

OTHER PUBLICATIONS

Maheshwary, R., "3D Stacking: EDA Challenges & Opportunities," Synopsys Predictable Success, Sematech Symposium, Tokyo, Japan, Sep. 24, 2009, pp. 1-11, Gartner Semiconductor Industry Briefing.

\* cited by examiner

*Primary Examiner* — Tuan T Dinh
*Assistant Examiner* — Mukund G Patel
(74) *Attorney, Agent, or Firm* — Slater Matsil, LLP

(57) ABSTRACT

Enhanced electrostatic discharge (ESD) protection schemes of an integrated circuit in three-dimensional (3D) integrated circuit (ICs) packages, and methods of forming the same are presented in the disclosure. An array of ESD protection devices can be formed in an interposer and placed under one or a plurality of ICs so that a hard block inside an IC on top of the interposer can be connected to an ESD protection device of the array and is protected from ESD. The ESD protection device cell of the array is connected to a Voltage Regulator Module (VRM) which can be placed inside the interposer, on the surface of the interposer, or on the surface of a printed circuit board (PCB). The ESD protection array is of generic nature and can be used with many kinds of ICs to form a three-dimensional IC package. Further embodiments of ESD protection for 3D IC package is disclosed where an ESD protection device inside a first IC 2 can be shared with another IC 1 to protect a hard block within IC 1.

20 Claims, 9 Drawing Sheets

VRM inside an interposer, ESD inside IC2

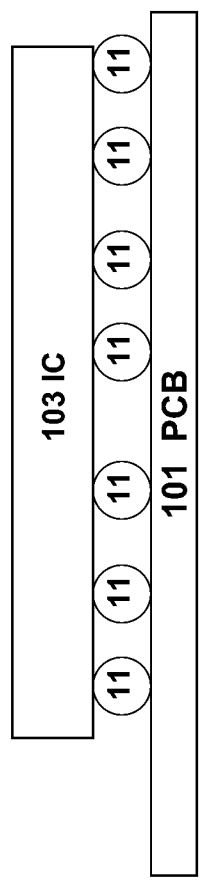
Figure 1  2D IC package (prior art)

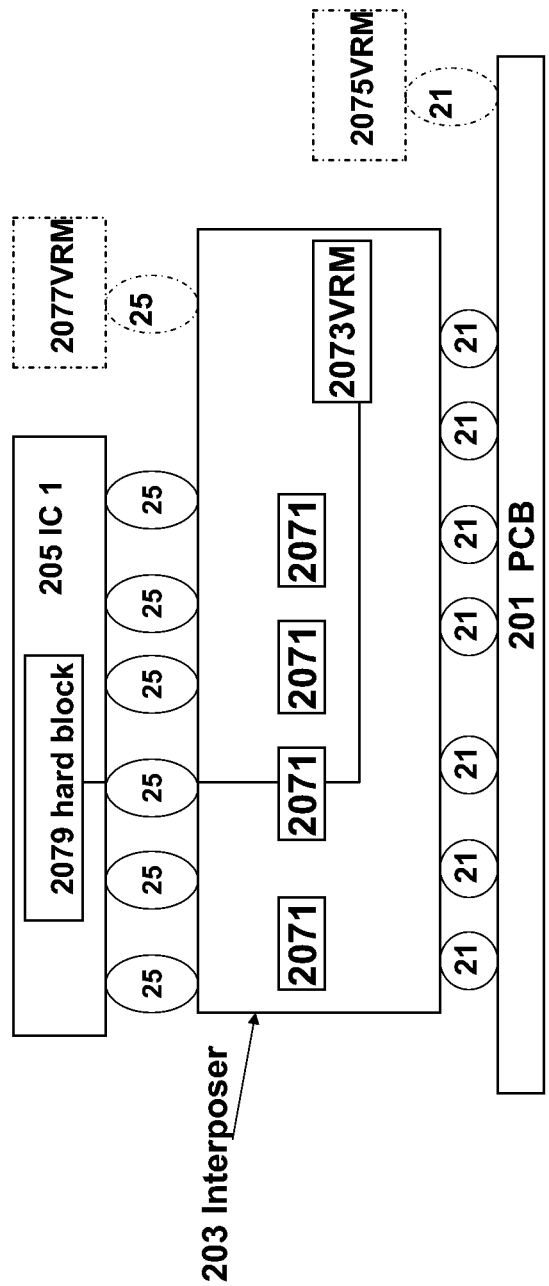
Figure 2 (a) Interposer Embodiment with an array of ESD cells

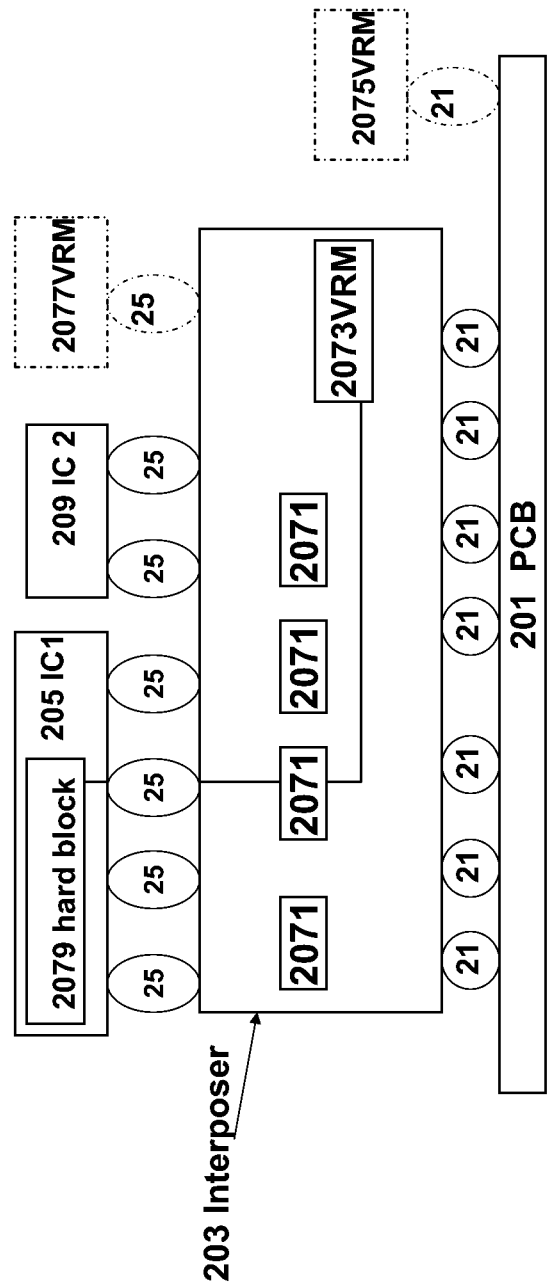
Figure 2 (b) Interposer Embodiment with an array of ESD cells

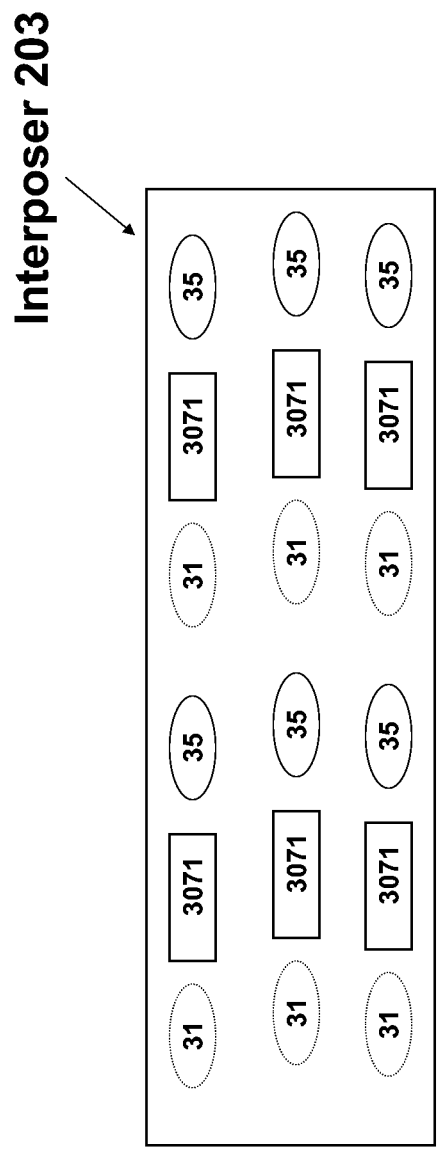
Figure 3 (a) Top view of ESD Protection device connection

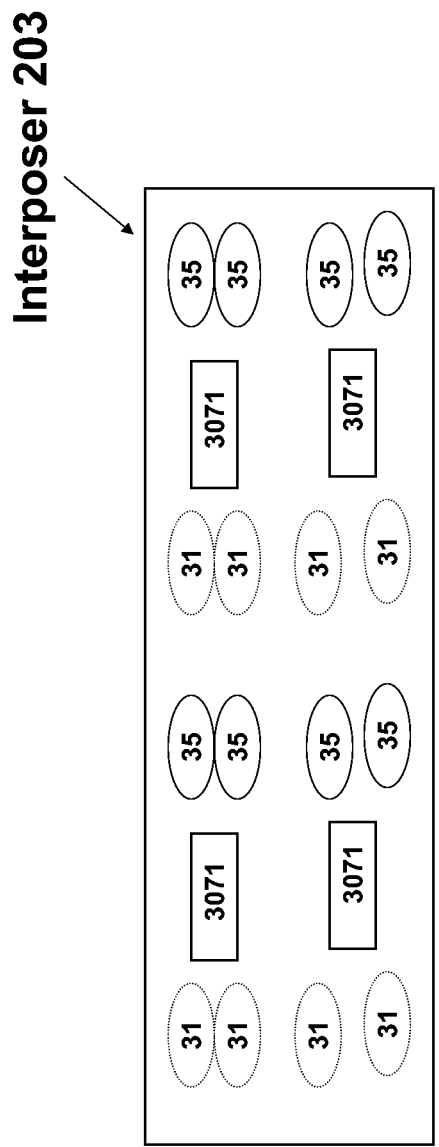
Figure 3 (b) Top view of shared ESD Protection device connection

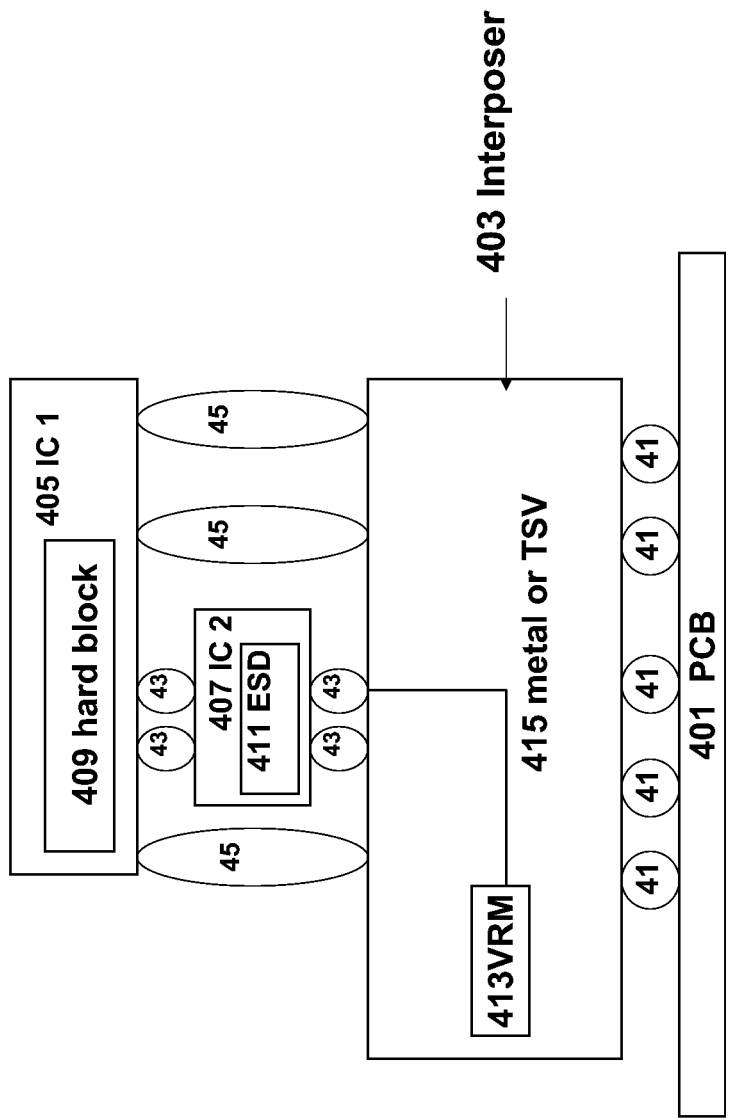
Figure 4 (a) VRM inside an interposer, ESD inside IC2

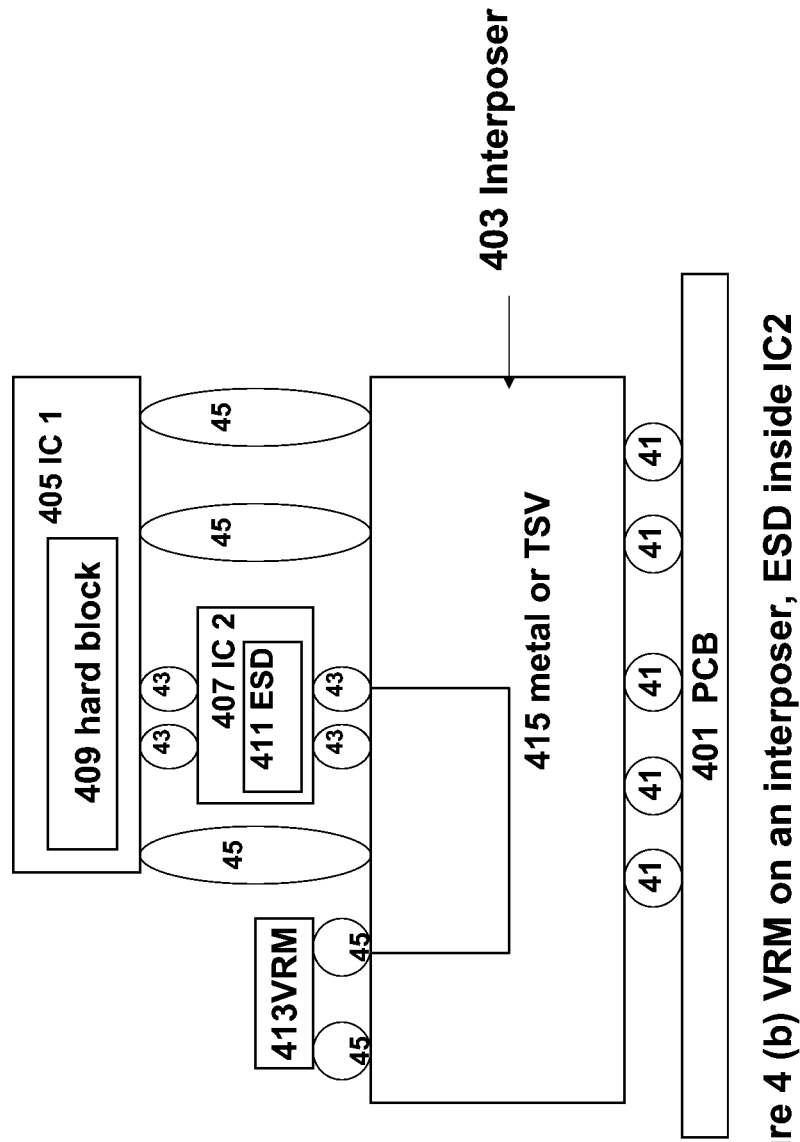
Figure 4 (b) VRM on an interposer, ESD inside IC2

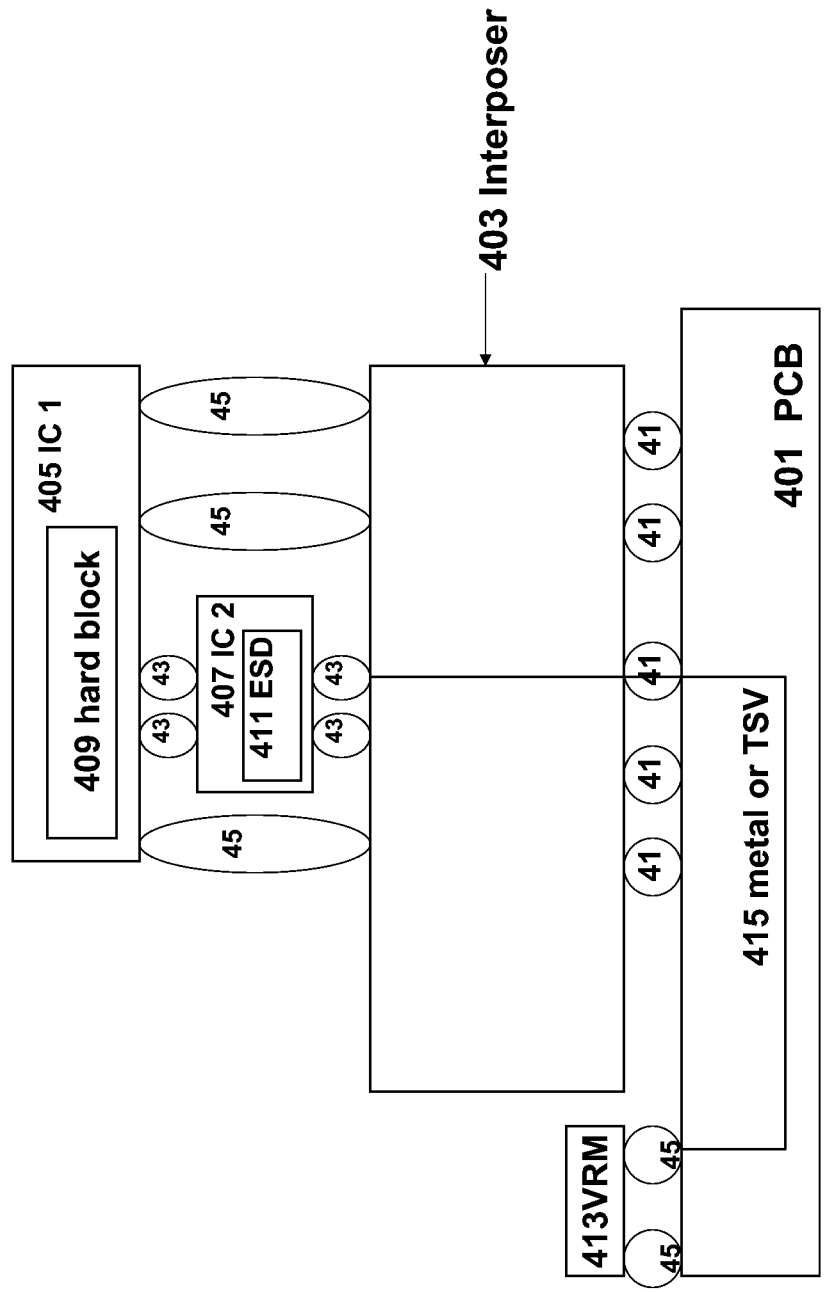

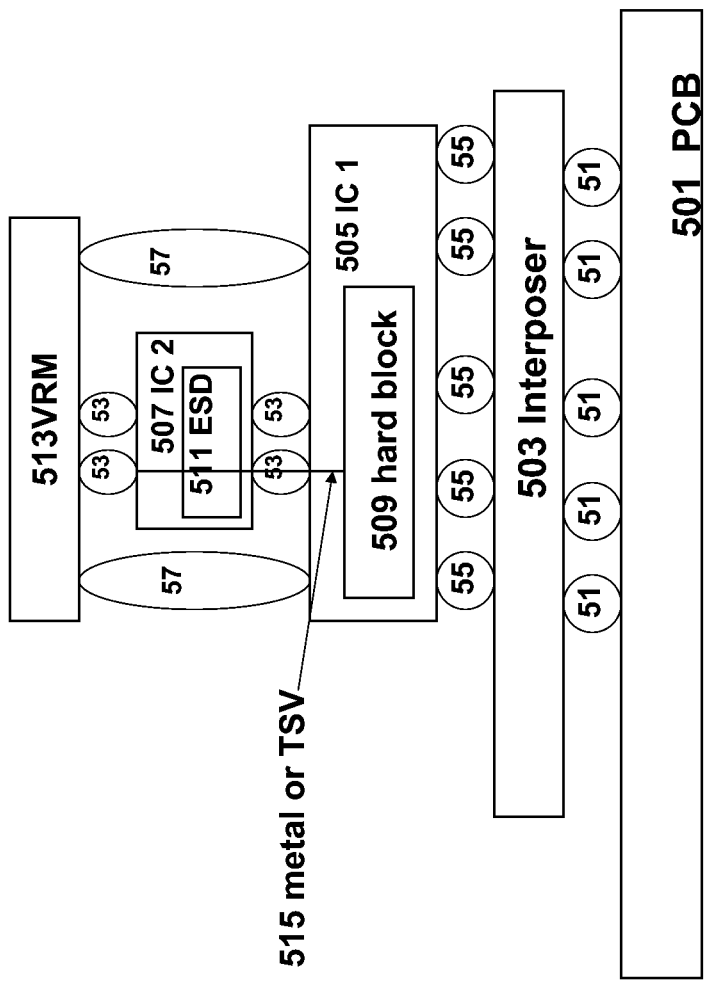
Figure 5 VRM on top of IC2, ESD inside IC2

ENHANCED ESD PROTECTION OF INTEGRATED CIRCUIT IN 3DIC PACKAGE

BACKGROUND

Since the invention of the integrated circuit, the semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D integrated circuit formation, there are physical limits to the density that can be achieved in two dimensions. One of these limits is the minimum size needed to make these components. Also, when more devices are put into one chip, more complex designs are required.

Three-dimensional (3D) integrated circuits (ICs) are therefore created to resolve the above-discussed limitations. A three-dimensional integrated circuit (3D IC, 3D-IC, or 3-D IC) is a chip in which two or more layers of active electronic components are integrated both vertically and horizontally into a single circuit. In a typical formation process of 3D IC, two wafers, each including an integrated circuit, are formed. The wafers are then bonded with the devices aligned. Through-substrate vias (TSV) are formed to interconnect devices on the first and second substrates. Other technologies for 3D IC exist too, such as Die-on-Wafer and Die-on-die. For Die-on-Wafer technology, electronic components are built on two semiconductor wafers. One wafer is diced; the singulated dies are aligned and bonded onto die sites of the second wafer. As in the wafer-on-wafer method, thinning and TSV creation are performed either before or after bonding. Additional dies may be added to the stacks before dicing. For Die-on-Die technology, electronic components are built on multiple dies, which are then aligned and bonded. Thinning and TSV creation may be done before or after bonding.

A 3D IC is a single chip. All components on the layers communicate with on-chip signaling, whether vertically or horizontally. Much higher device density has been achieved using 3D IC technology, and up to six layers of wafers have been bonded. As a result, the total wire length is significantly reduced. The number of vias is also reduced. Accordingly, 3D IC technology has the potential of being the mainstream technology of the next generation.

Electrostatic discharge (ESD) is the sudden and momentary electric current that flows between two objects at different electrical potentials. The term is usually used to describe momentary unwanted currents that may cause damage to electronic equipment. ESD is a serious issue in integrated circuits, which can suffer permanent damage when subjected to high voltages.

BRIEF DESCRIPTION OF THE DRAWINGS

For a more complete understanding of the present invention, and the advantages thereof, reference is now made to the following descriptions taken in conjunction with the accompanying drawing, in which:

FIG. 1 is a schematic view of an integrated circuit connected to a Printed Circuit Board (PCB) resulting in a two-dimensional integrated circuit;

FIGS. 2 (a)-(b) are schematic views of illustrative embodiments of an interposer within different kinds of three-dimensional Integrated Circuit packages;

FIGS. 3 (a)-(b) are schematic views of top views of an interposer with an array of Electrostatic discharge (ESD) cells.

FIGS. 4 (a)-(c) are schematic views of an ESD cell inside an Integrated Circuit (IC) 2 and connected to a hard block in another IC (IC 1), and a Voltage Regulator Module (VRM) is placed in various places.

FIG. 5 is a schematic view of an ESD cell inside an Integrated Circuit (IC) 2 and connected to a hard block in another IC (IC 1), and a Voltage Regulator Module (VRM) is on top of IC 2.

DETAILED DESCRIPTION OF ILLUSTRATIVE EMBODIMENTS

The making and forming of the present exemplary embodiments are discussed in detail below. It should be appreciated, however, that embodiments of the present invention provide many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely an enhanced electrostatic discharge (ESD) protection of an integrated circuit in three-dimensional (3D) integrated circuit (ICs) packages, and methods of forming the same.

FIG. 1 is a schematic view of a conventional two-dimensional (2D) integrated circuit package. An IC 103 is connected to a Printed Circuit Board (PCB) 101 by way of solder balls 11. Those of skill in the art will readily recognize that other packaging materials can be connected to the IC 103 in place of the PCB. The number of solder balls shown is only for illustrative purpose. In alternative methods, fusion bonding or diffusion bonding may be used to form the bonding between the PCB and the IC. Those of skill in the art will readily recognize that there are many variations which implement equivalent functions and the illustrative schematic view is made for illustrative purpose only.

An integrated circuit (IC) connected to external ports is susceptible to damaging electrostatic discharge (ESD) pulses from the operating environment and peripherals. An ESD event is the transfer of energy between two bodies at different electrostatic potentials, either through contact or via an ionized ambient discharge (a spark). ESD protection devices attempt to divert this potentially damaging charge away from sensitive circuitry and protect the system from permanent damage. Traditional methods of shunting ESD energy to protect ICs involve devices such as zener diodes, metal oxide varistors (MOVs), transient voltage suppression (TVS) diodes, and regular complementary metal oxide semiconductor (CMOS) or bipolar clamp diodes.

FIG. 2 (a) is a schematic view of an interposer embodiment within a three-dimensional (3D) IC package, wherein an array of patterned ESD protection devices 2071 is provided in an interposer 203. An integrated circuit IC 1 (205) is attached to a first side of the interposer 203. Solder balls 25 are used to provide electrical connection between IC 1 (205) and the interposer 203. A second side of the interposer 203 is attached to a PCB 201 by solder balls 21. One skilled in the art will recognize the embodiment is not limited to a PCB, and that any appropriate supporting substrate is contemplated, including a silicon substrate, an alumina substrate, a glass substrate, a sapphire substrate, and the like. Solder balls 21 provide electrical connection between the interposer 203 and the PCB 201. One skilled in the art will recognize the embodiment is not limited to solder balls 21 and 25 to provide electrical connections. Other conductive structures may be used in place of solder balls 21 or 25 to provide electrical connections, such as balls, bumps, columns, pillars, or other structures formed from a conductive material, such as solder, metal, or metal alloy to facilitate electrical connections. An interposer provides a matching coefficient of thermal expansion to the integrated circuit die in order to reduce the potential solder failure between the integrated circuit die and the package substrate caused by thermal stresses. In addition, other circuit elements may be incorporated into the interposer 203. These circuit elements may be active, passive, or a combination of active and passive elements, including capacitors, resistors, and more, which are not shown in the figure.

In FIG. 2(*a*), a plurality of ESD protection devices 2071 in an ESD protection device array are formed inside the interposer 203. The number of ESD protection devices 2071 is shown only for illustrative purpose. Different number of ESD protection devices can be formed in the interposer 203.

The power Vdd and the ground Vss are provided by a voltage regulator module (VRM) 2073 to the ESD protection device 2071, which is further connected to a circuit protected from ESD, which is also called a "hard block" 2079 in an IC 205. The VRM 2073, the ESD cell 2071, and the hard block 2079 are connected by way of a metal connection and/or a Through-Silicon Via (TSV) and solder balls 25.

The VRM 2073 is illustratively shown inside the 203 Interposer. The VRM 2073 can be placed elsewhere in the 3D IC package, such as shown by dashed lines VRM 2077 to place it on a surface of the interposer 203, or on a surface of the PCB 201 as VRM 2075. Regardless of where the VRM is placed, it is connected to an ESD protection cell 2071 by way of metal connections and/or a TSV and/or solder ball 21/25.

The position of the 2079 hard block shown in FIG. 2 (*a*) is only for illustrative purpose. The 2079 hard block could be placed anywhere in the IC 205. The patterned ESD protection device 2071 inside the interposer 203 is designed that for any position of the hard block, it is possible to find an ESD cell substantially vertically beneath the hard block to connect to the hard block to protect it from ESD. The ESD protection device array 2071 is made to be generic, configurable, and can be of multiple uses, resulting in the interposer to be of generic use in 3DIC package. The ESD protection devices 2071 can be illustratively implemented but not limited to using any of the available schemes.

More than one IC can be formed in a 3D IC package, as shown in FIG. 2(*b*). FIG. 2(*b*) is a schematic view of a three-dimensional (3D) IC package where two separated ICs (205 IC1 and 209 IC2) are attached to a first side of an interposer 203. Solder balls 25 are used to provide electrical connection between ICs and the interposer 203. One skilled in the art will recognize the embodiment is not limited to solder balls 25 to provide electrical connections. Other conductive structures may be used in place of solder balls 25 to provide electrical connections, such as balls, bumps, columns, pillars, or other structures formed from a conductive material, such as solder, metal, or metal alloy to facilitate electrical connections.

For the schematic view of 3D IC packages shown in FIG. 2(*b*), a hard block 2079 can be placed inside either IC 205 or IC 209, and connected to an ESD protection device among the ESD protection device array inside the 203 Interposer. The ESD protection device array inside the 203 Interposer is designed to make such connection configurable so that regardless the location of the hard block 2079 is inside IC 205 or inside 209, the hard block can be connected to an ESD protection device and be protected from ESD. In this way, the interposer 203 is generic in 3D IC packages, instead of custom made for a specific 3D IC package. Similarly, the power supply and ground wires to an ESD protection cell are provided by VRM, which could be placed inside the interposer 203 (VRM 2073), on a surface (VRM 2077) of the interposer 203, or on a surface (VRM 2075) of the PCB 201, as shown in FIG. 2(*b*).

FIGS. 3(*a*)-(*b*) are schematic views of an array of ESD protection devices 3071 inside an interposer 203, where the bonds 31 and 35 form a fragment of bump patterns or footprints for connecting integrated circuit, and they also show the exemplary location of the array of ESD protection cells. Bonds 31 and 35 could be assigned to signals or power (Vdd and Vss). If the bond is assigned to signal, the corresponding ESD cell will be remained unused and will not be connected to corresponding bonds. But if the bond is assigned to power, then the ESD cell can be easily used and connected to corresponding bonds by one or some metals change. In this way, the interposer can be reused to save costs, no matter where the hard block is.

The number of ESD protection devices 3071 and the number of bond balls are only for illustrative purpose. There may be a different number of ESD protection devices, and a different number of bond balls. For the top view of the illustrative embodiment, the VRM block is not shown. It is possible that multiple pairs of power supply bumps can share an ESD protection device, which is shown in FIG. 3 (*b*) by its top view, as an illustrative example.

An illustrative embodiment of a 3D IC package shares an ESD protection device inside one IC to protect a hard block inside another IC in a 3DIC package. FIGS. 4(*a*)-(*c*) are schematic views of a three-dimensional IC wherein a bigger IC IC 1 (405) is on top of a smaller sized IC 2 (407), which are all connected to an interposer 403 on top of a PCB 401. The smaller IC 2 (407) comprises an ESD protection device (411), which can be shared with 405 to protect a hard block (409) inside 405. Furthermore, a VRM 413 can be selectively placed inside an interposer (FIG. 4(*a*)), on an interposer (FIG. 4(*b*)), or on a PCB (FIG. 4(*c*)), and connected to the ESD protection device 411 inside 407 by way of metal or TSV 415 and/or solder balls 41/43/45. The VRM is connected to the ESD protection device 411 first and then connected to the hard block which is the circuit protected from ESD. In this way, any potentially damaging ESD pulses can be diverted away from the sensitive hard block to protect the hard block 409. Solder balls 45, 43, and 41 are used to provide electrical connection between IC 1 (405) and the interposer 403, between the two ICs 405 and 407, between IC 2 (407) and the interposer 403, between VRM and interposer or PCB, and between the interposer and the PCB, respectively. One skilled in the art will recognize the embodiment is not limited to solder balls 45, 43, and 41 to provide electrical connections. Other conductive structures may be used in place of solder balls 45, 43, and 41 to provide electrical connections, such as balls, bumps, columns, pillars, or other structures formed from a conductive material, such as solder, metal, or metal alloy to facilitate electrical connections.

FIG. 5 is a schematic view of a three-dimensional IC wherein a smaller IC IC2 (507) is on top of a bigger sized IC 1 (505), which are connected to an interposer 503 on top of a PCB 501. The smaller 507 comprises an ESD protection device 511, which can be shared with 505 to protect a hard block 509 inside 505. Furthermore, an VRM 513 is placed on top of 507, and connected to the ESD protection device 511 inside 507 by way of metal or TSV 515 and solder balls 53. The VRM is connected to the ESD protection device 511 first and then connected to the hard block 509 which is the circuit protected from ESD. In this way, any potentially damaging ESD pulses can be diverted away from the sensitive hard block to protect the hard block 509. Solder balls 57, 55, 53, and 51 are used to provide electrical connection between IC 1 (505) and the interposer 503, between the two ICs 505 and 507 and VRM 513, and between the interposer and the PCB, respectively. One skilled in the art will recognize the embodiment is not limited to solder balls 57, 55, 53, and 51 to provide electrical connections. Other conductive structures may be used in place of solder balls 57, 55, 53, and 51 to provide electrical connections, such as balls, bumps, columns, pillars, or other structures formed from a conductive material, such as solder, metal, or metal alloy to facilitate electrical connections. The numbers of bumps 57, 55, 53, and 51 are only for illustrative purpose too. Other numbers of bumps can be used.

What is claimed is:

1. A device comprising:
   an interposer electrically connected to a supporting substrate;
   a configurable and patterned array of electrostatic discharge (ESD) protection cells inside the interposer; and
   an integrated circuit (IC) electrically connected to the interposer comprising a hard block, the hard block being electrically connected to at least one ESD protection cell of the array of ESD protection cells.

2. The device of claim 1, wherein:
   the connection between the hard block and an ESD protection cell is made by way of metal.

3. The device of claim 1, wherein:
   the connection between the hard block and an ESD protection cell is made by way of a through-substrate via (TSV).

4. The device of claim 1, further comprising:
   a power supply wire and a ground wire electrically connected to an ESD protection cell of the array of ESD protection cells.

5. The device of claim 1, further comprising:
   a Voltage Regulator Module (VRM) connected to an array of ESD protection cells.

6. The device of claim 1, further comprising:
   a plurality of VRMs connected to an array of ESD protection cells.

7. The device of claim 5, wherein:
   the VRM is located inside the interposer.

8. The device of claim 5, wherein:
   the VRM is located on a surface of the interposer.

9. The device of claim 5, wherein:
   the VRM is located on a surface of the supporting substrate.

10. A three-dimensional Integrated Circuit (3DIC) package comprising:
    a supporting substrate; and
    an interposer electrically connected to the supporting substrate on one side and electrically connected to an IC on the other side of the interposer, wherein a cell of an array of Electrostatic discharge (ESD) protection cells inside the interposer is electrically connected to a corresponding hard block inside the IC, the array of ESD protection cells is configurable and patterned.

11. The 3DIC package of claim 10, further comprising:
    a Voltage Regulator Module (VRM) being connected to an ESD protection cell.

12. The 3DIC package of claim 11, wherein:
    the VRM is placed inside the interposer, on a surface of the interposer, or on a surface of the supporting substrate.

13. The 3DIC package of claim 10, wherein:
    the interposer is electrically connected to a plurality of ICs, a hard block inside one of the plurality of ICs being electrically connected to a corresponding cell of the array of ESD protection cells.

14. A 3DIC package comprising:
    a supporting substrate;
    an interposer electrically connected to the supporting substrate on one side and electrically connected to a first and a second ICs on the other side;
    the first IC containing a hard block; and
    the second IC containing an ESD protection cell electrically connected to the hard block.

15. The 3DIC package of claim 14, further comprising:
    a Voltage Regulator Module (VRM) being electrically connected to the ESD protection cell within the second IC.

16. The 3DIC package of claim 15, wherein:
    the VRM is placed inside the interposer, on a surface of the interposer, or on a surface of the supporting substrate.

17. The 3DIC package of claim 15, wherein:
    the VRM is placed on top of the second IC.

18. A method of forming a three-dimensional Integrated Circuit (3DIC) package comprising:
    forming a electrical connection between a supporting substrate and an interposer on one side; and
    forming a electrical connection between another side of the interposer and a plurality of ICs, wherein a first IC of the plurality of ICs contains a hard block electrically connected to an ESD protection cell within a second IC of the plurality of ICs.

19. The method of claim 18, further comprising:
    forming an electrical connection between a Voltage Regulator Module (VRM) and the ESD protection cell within the second IC.

20. The method of claim 18, further comprising:
    selectively placing the VRM inside the interposer, on a surface of the interposer, on a surface of the supporting substrate, or on the top of second IC.

* * * * *